(12) United States Patent
Bangsaruntip et al.

(10) Patent No.: US 8,541,774 B2
(45) Date of Patent: Sep. 24, 2013

(54) HYBRID CMOS TECHNOLOGY WITH NANOWIRE DEVICES AND DOUBLE GATED PLANAR DEVICES

(75) Inventors: Sarunya Bangsaruntip, Mount Kisco, NY (US); Josephine B. Chang, Mahopac, NY (US); Leland Chang, New York, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/605,076

(22) Filed: Sep. 6, 2012

(65) Prior Publication Data

US 2013/0026451 A1    Jan. 31, 2013

Related U.S. Application Data

(63) Continuation of application No. 13/189,999, filed on Jul. 25, 2011.

(51) Int. Cl.
*H01L 27/06* (2006.01)

(52) U.S. Cl.
USPC ....... 257/24; 257/E27.064; 977/762; 977/888

(58) Field of Classification Search
USPC ................ 257/24, E27.064; 977/762, 888
See application file for complete search history.

(56) References Cited

U.S. PATENT DOCUMENTS

| | | | |
|---|---|---|---|
| 6,515,339 B2 | 2/2003 | Shin et al. | |
| 7,564,269 B2 | 7/2009 | Bertin | |
| 7,808,082 B2 | 10/2010 | Yang et al. | |
| 7,842,559 B2 | 11/2010 | Jakschik et al. | |
| 2004/0195646 A1 | 10/2004 | Yeo et al. | |
| 2008/0169535 A1 | 7/2008 | Butt et al. | |
| 2009/0137091 A1 | 5/2009 | Lee | |
| 2011/0012176 A1* | 1/2011 | Chidambarrao et al. | 257/255 |
| 2011/0133167 A1* | 6/2011 | Bangsaruntip et al. | 257/24 |

OTHER PUBLICATIONS

Yang et al., "Hybrid-Orientation Technology (HOT): Opportunities and Challenges", IEEE Transactions on Electron Devices, vol. 43, No. 5, May 2006.
Huang et al., "Amorphization and Templated Recrystallization (ATR) Study for Hybrid Orientation Technology (HOT) Using Direct Silicon Bond (DSB) Substrates", IEEE 1-4244-058508/07; 2007.
Bourdelle et al., "Smart Cut Transfer of 300 mm (110) and (100) Si Layers for Hybrid Orientation Technology", 2004 IEEE International SOI Conference, Oct. 2004.

(Continued)

*Primary Examiner* — Colleen Matthews
(74) *Attorney, Agent, or Firm* — Harrington & Smith

(57) ABSTRACT

A substrate includes a first source region and a first drain region each having a first semiconductor layer disposed on a second semiconductor layer and a surface parallel to {110} crystalline planes and opposing sidewall surfaces parallel to the {110} crystalline planes; nanowire channel members suspended by the first source region and the first drain region, where the nanowire channel members include the first semiconductor layer, and opposing sidewall surfaces parallel to {100} crystalline planes and opposing faces parallel to the {110} crystalline planes. The substrate further includes a second source and drain regions having the characteristics of the first source and drain regions, and a single channel member suspended by the second source region and the second drain region and having the same characteristics as the nanowire channel members. A width of the single channel member is at least several times a width of a single nanowire member.

12 Claims, 12 Drawing Sheets

(56) References Cited

OTHER PUBLICATIONS

Doris et al., :A Simplified Hybrid Orientation Technology (SHOT) for High Performance CMOS, 2004 Symposium on VLSI Technology Digest of Technical Papers.

Bangsaruntip et al., "Gate-all-Around Silicon Nanowire 25-State CMOS Ring Oscillators with Diameter Down to 3 nm", 2010 Symposium on VLSI Technology Digest of Technical Papers.

Destefanis, et al., "High Pressure in situ HCl Etching of Si1-xGEx Versus Si for Advanced Devices", Semiconductor Science and Technology 2008.

* cited by examiner

HYBRID CMOS TECHNOLOGY WITH NANOWIRE DEVICES AND DOUBLE GATED PLANAR DEVICES

CROSS-REFERENCE TO A RELATED PATENT APPLICATION

This patent application is a divisional application of copending U.S. patent application Ser. No. 13/189,999, filed Jul. 25, 2011, the disclosure of which is incorporated by reference herein in its entirety.

TECHNICAL FIELD

The present invention relates to semiconductor nanowire field effect transistors and to methods that allow the fabrication of nanowire field effect transistor devices and planar field effect transistor devices.

BACKGROUND

The fabrication of a nanowire field effect transistor (FET) with a gate conductor surrounding the nanowire channel (also known as a gate-all-around nanowire FET) includes suspension of the nanowires. Suspension of the nanowires allows for the gate conductor to cover all surfaces of the nanowires.

The fabrication of a gate-all-around nanowire FET typically includes the following steps: (1) definition of the nanowires between source and drain regions by patterning a silicon-on-insulator (SOI) layer; suspension of the nanowires by isotropic etching that undercuts the insulator on which the nanowires are resting, also undercutting the insulator at the edge of the source and drain region; a blanket and conformal deposition of the gate conductor that wraps around the suspended nanowires and also fills the undercut at the edge of the source and drain regions; and definition of the gate line which includes the etching of the gate line and removal of gate conductor material from all regions outside the gate line, including gate material deposited in the cavities at the edge of the source and drain regions.

While the nanowire FET includes doped portions of nanowire that contact the channel region and serve as source and drain regions of the device, planar FETs include planar channel, source, and drain regions.

SUMMARY

In accordance with a first aspect thereof the exemplary embodiments of this invention provide a method for simultaneously forming a nanowire field effect transistor (FET) device and a double gate FET device. The method comprises depositing a first semiconductor layer on a substrate where a surface of the first semiconductor layer is parallel to {110} crystalline planes of the first semiconductor layer; epitaxially depositing a second semiconductor layer on the first semiconductor layer; etching the first semiconductor layer and the second semiconductor layer to define a nanowire channel portion comprising a plurality of nanowires that connect a first source region pad to a first drain region pad, the nanowire channel portion having sidewalls that are parallel to {100} crystalline planes, and the first source region pad and the first drain region pad having sidewalls that are parallel to {110} crystalline planes. The step of etching further comprises simultaneously etching the first semiconductor layer and the second semiconductor layer to define a single channel portion that connects a second source region pad to a second drain region pad, the channel portion having sidewalls that are parallel to {100} crystalline planes, and the second source region pad and the second drain region pad having sidewalls that are parallel to {110} crystalline planes. The method further includes performing an anisotropic etch that removes primarily material from {100} crystalline planes of the first semiconductor layer such that the nanowire channel portion and the channel portion are suspended by the first and second source region pads and the first and second drain region pads, respectively.

In accordance with another aspect thereof the exemplary embodiments of this invention provide a method for simultaneously forming the nanowire field effect transistor (FET) device and the double gate FET device. The method comprises using a multi-layered structure comprising a crystalline layer disposed on a substrate and a silicon layer disposed on the crystalline layer, etching portions of the silicon layer and the crystalline layer to define a nanowire portion in the silicon layer having a longitudinal orientation along a lattice plane (110) of the crystalline layer, the nanowire portion connected to a first anchor portion having a longitudinal orientation along a lattice plane (001) of the crystalline layer and a second anchor portion having a longitudinal orientation along the lattice plane (001) of the crystalline layer while simultaneously etching portions of the silicon layer and the crystalline layer to define a channel portion in the silicon layer having a longitudinal orientation along a lattice plane (110) of the crystalline layer. The channel portion is connected to a third anchor portion having a longitudinal orientation along a lattice plane (001) of the crystalline layer and a fourth anchor portion having a longitudinal orientation along the lattice plane (001) of the crystalline layer. A width of the single channel portion is at least several times a width of a single nanowire. The method further includes anisotropically etching to primarily remove the crystalline layer under the nanowire portion and under the channel portion while marginally etching portions of the crystalline layer under the first, second, third and fourth anchor portions and forming a gate structure on the nanowire portion and another gate structure on the channel portion.

In accordance with a further aspect thereof the exemplary embodiments of this invention provide a substrate that comprises a first source region comprising a first semiconductor layer disposed on a second semiconductor layer, the first source region having a surface parallel to {110} crystalline planes and opposing sidewall surfaces parallel to the {110} crystalline planes; a first drain region comprising the first semiconductor layer disposed on the second semiconductor layer, the first source region having a face parallel to the {110} crystalline planes and opposing sidewall surfaces parallel to the {110} crystalline planes; and a plurality of nanowire channel members suspended by the first source region and the first drain region, where the nanowire channel members include the first semiconductor layer, and opposing sidewall surfaces parallel to {100} crystalline planes and opposing faces parallel to the {110} crystalline planes. The substrate further comprises a second source region comprising the first semiconductor layer disposed on the second semiconductor layer, the second source region having a surface parallel to {110} crystalline planes and opposing sidewall surfaces parallel to the {110} crystalline planes; a second drain region comprising the first semiconductor layer disposed on the second semiconductor layer, the second source region having a face parallel to the {110} crystalline planes and opposing sidewall surfaces parallel to the {110} crystalline planes; and a single channel member suspended by the second source region and the second drain region, where the single channel member includes the first semiconductor layer, and opposing sidewall surfaces parallel to {100} crystalline planes and opposing faces parallel to the {110} crystalline planes. A width of the single channel member is at least several times a width of a single nanowire member.

In accordance with yet another aspect thereof the exemplary embodiments of this invention provide an integrated circuit that comprises a plurality of field effect transistor (FET) devices disposed over a common substrate. The plurality of FET devices variously comprise a first source region comprising a first semiconductor layer disposed on a second semiconductor layer, the first source region having a surface parallel to {110} crystalline planes and opposing sidewall surfaces parallel to the {110} crystalline planes; a first drain region comprising the first semiconductor layer disposed on the second semiconductor layer, the first source region having a face parallel to the {110} crystalline planes and opposing sidewall surfaces parallel to the {110} crystalline planes; a plurality of nanowire channel members suspended by the first source region and the first drain region, where the nanowire channel members include the first semiconductor layer, and opposing sidewall surfaces parallel to {100} crystalline planes and opposing faces parallel to the {110} crystalline planes; a second source region comprising the first semiconductor layer disposed on the second semiconductor layer, the second source region having a surface parallel to {110} crystalline planes and opposing sidewall surfaces parallel to the {110} crystalline planes; a second drain region comprising the first semiconductor layer disposed on the second semiconductor layer, the second source region having a face parallel to the {110} crystalline planes and opposing sidewall surfaces parallel to the {110} crystalline planes; a single channel member suspended by the second source region and the second drain region, where the single channel member includes the first semiconductor layer, and opposing sidewall surfaces parallel to {100} crystalline planes and opposing faces parallel to the {110}crystalline planes; and a first gate formed around at least a portion of the nanowire channel members and a second gate formed around at least a portion of the single channel member.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features and advantages of the invention are apparent from the following detailed description taken in conjunction with the accompanying drawings in which:

FIGS. 1A-8B illustrate an exemplary method for forming a nanowire suspended gate field effect transistor (FET) device, wherein FIG. 1A illustrates a cross-sectional view of a substrate along the line 1A (of FIG. 1B);

FIG. 8B illustrates a top down view and depicts the resultant structure following silicidation.

DETAILED DESCRIPTION

Figure 1A:
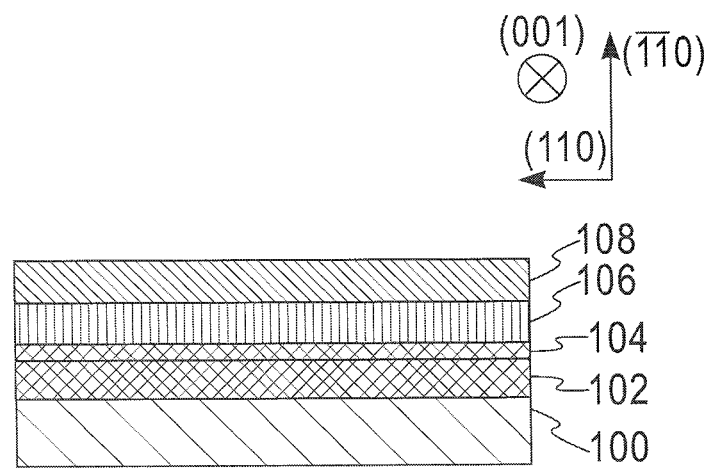

The scaling of future CMOS technologies requires undoped device structures that control short channel effects with device geometry. Nanowire (NW) gate-all-around (GAA) FETs have shown promise in this area. One drawback of nanowire FET structures is that they have a circular or elliptical shape that in effect creates a very complex crystallographic orientation. While it is well known that NFET devices in planar structures have the highest mobility on {100} Si surfaces, on thin film (extremely thin silicon on insulator ETSOI) and planar (partially depleted silicon on insulator PDSOI) short channel structures, the {110} orientation for the NFET does not negatively impact the drive current. In some GAA NW FET devices it has been observed that the NFET drive currents are equivalent to, or slightly lower than the PFET drive currents.

An aspect of the embodiments of this invention is to provide flexibility in NW FETs through the use of a hybrid approach that permits both NFET and PFET NW FETs as well as double gated NFETs and PFETs on the same wafer. The double gated FETs may be used in cases where more current drive is required (e.g., input/output circuitry) or when this structure is more advantageous than an NFET.

A hybrid structure is provided where PFETs are built in a NW device and the NFETs are built in an epi-merged suspended back-gated (or gate all around) device. The NFETs have the advantage of a 100 surface orientation while the PFETs have the advantage of an orientation averaged surface.

The process flow can be similar to that of a standard NW process flow except that a 110 wafer surface orientated wafer is used (directional etch process for suspension); and narrow width regions are defined for the NW devices while wider width regions (e.g., at least several times the width of a nanowire) are defined for the double gate planar devices. The final structure has NW devices and double gates devices on the same wafer.

A further aspect of this invention is to permit both double-gate planar devices and FINFETs to be provided on the same wafer.

This aspect of the invention combines the use of FINFET devices with double-gated FETs. Depending upon the wafer surface orientation and the rotation of the device with respect to the wafer, several preferred combinations are possible. In general, it is preferred for the NFETs to maintain the conduction surface orientation {100}, while for the PFET the preferred conduction surface orientation is {110} or {111}.

The processing can be in a manner similar to a conventional gate-all-around NW FET process flow with the following enhancements.

The starting substrate has a {110} surface orientation so that a directional etch process can be employed for the double gate suspension. Prior to patterning the active silicon region vertical steps are etched in the active silicon. These thinner Si regions eventually become where the double-gated devices are formed. The thicker regions are where the FINFET devices are formed. After patterning the double-gated regions are suspended and the FIN regions are then etched to the buried oxide BOX. The FIN regions are then optionally protected while back-gated regions are suspended (they may also be suspended). Gate patterning and deposition may be performed at the same time for both types of devices with ALD/CVD techniques.

The exemplary embodiments of this invention employ various features in combination to provide an assemblage having a nanowire FET and a double gated FET.

An integrated circuit may include a number of different types of FET devices. Examples of FET devices include a planer channel FET and a nanowire channel FET. A planar channel FET includes a silicon slab, a gate line formed over the silicon slab, a source region and a drain region adjacent to the gate line, and a channel region near the surface of the slab under the gate. The channel electrically connects the source region to the drain region while the gate controls the current in the channel. A nanowire channel FET includes silicon nanowires that connect on each side to a source region and a drain region, and a gate line that fully (or partially) surrounds the nanowires. The channel forms at the surface of the nanowires under the gate (or in the bulk of the nanowires for nanowires with diameter smaller than about 5 nm). When the gate fully surrounds the nanowire, the device is referred to as the gate-all-around (GAA) FET. When the gate partially surrounds the nanowires, as in the case when the nanowire is attached to an insulator, the device can be referred to as an omega-gate FET.

The methods and resultant structures described below involve fabrication of different types of FETs on the same chip or wafer. In particular the method can form a plurality of gate-all-around (GAA) nanowire field effect transistors (FETs), a plurality of omega-gate nanowire FETs, and at least one double gated channel FET, where the plurality of GAA FETs, the plurality of omega-gate nanowire FETs, and the at least one double gated channel FET are disposed on a single wafer.

In a further aspect of the present invention the method for forming the various FETs uses a composite substrate structure having a SOI layer disposed on top of a BOX layer. Disposed on the SOI layer is a layer of SiGe and over the SiGe layer is a Si layer. Reference in this regard can be had to copending U.S. patent application Ser. No. 12/776,485, filed 10 May 2010. The disclosure of this copending application will be discussed first in the context of the formation of a nanowire FET array with reference to FIGS. 1A-8B. This teaching is then extended to describe the fabrication, on the same substrate, of an omega-gate FET and a double gate FET device. The double gate FET device resembles in some respects a wide, single nanowire FET device. It is shown that that height of the omega-gate FET can be increased by performing an initial step etch in the starting wafer to optionally create taller fin regions.

Copending U.S. patent application Ser. No. 12/776,485, filed 10 May 2010, describes depositing a first semiconductor layer on a substrate where a surface of the semiconductor layer is parallel to {110} crystalline planes of the semiconductor layer, epitaxially depositing a second semiconductor layer on the first semiconductor layer, etching the first semiconductor layer and the second semiconductor layer to define a nanowire channel portion that connects a source region pad to a drain region pad, the nanowire channel portion having sidewalls that are parallel to {100} crystalline planes, and the source region pad and the drain region pad having sidewalls that are parallel to {110} crystalline planes, and performing an anisotropic etch that removes primarily material from {100} crystalline planes of the first semiconductor layer such that the nanowire channel portion is suspended by the source region pad and the drain region pad.

The formation of the undercut (in step 3; described in the Background section above) imposes a limitation on the density of circuits built with a gate-all-around nanowire FET. The undercut size should be at least half of the width of the nanowires, or the nanowires may not be fully suspended by the etching. The undercut under the source (or drain) region should be smaller than half of the source (or drain) region width. If the source width is made narrower than two times the undercut size, the source (and drain) may not provide the anchoring for the suspended nanowires. The minimum width of the source and the drain dictates the area the device occupies. In addition to the circuit density limitation the presence of the undercut may lead to fabrication issues. The definition of the gate line (step 4 in the Background section above) includes the removal of all the gate conductor material that was deposited in the cavity formed by the undercut. This is typically performed by an isotropic etch, which also etches the gate line. As a result, control of the gate line dimensions may be difficult to obtain.

Figure 1B:
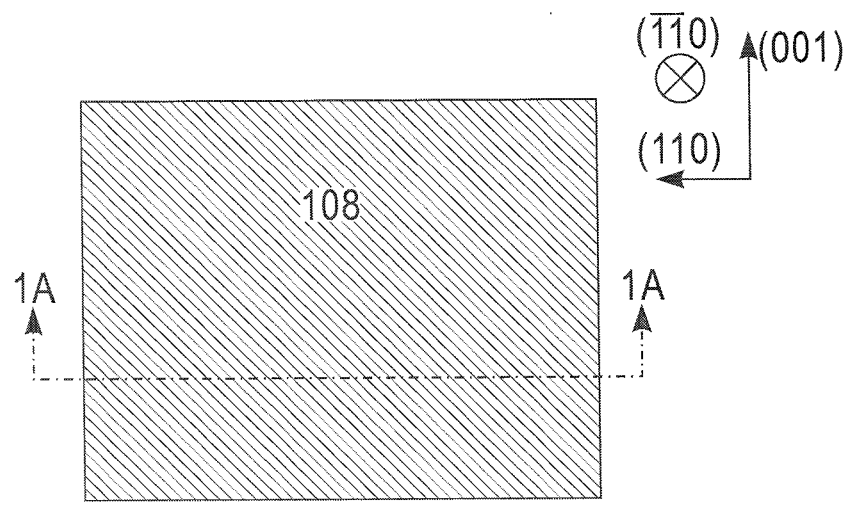
FIG. 1B illustrates a top down view of the substrate in an exemplary method for forming a field effect transistor (FET) device.

FIG. 1A illustrates a cross-sectional view along the line 1A (of FIG. 1B) and FIG. 1B illustrates a top down view of an exemplary method for forming a field effect transistor (FET) device. FIG. 1A includes a substrate 100 (for example a silicon substrate); a buried oxide (BOX) layer 102 disposed on the substrate 100; a silicon on insulator (SOI) layer 104 disposed on the BOX layer 102; a crystalline layer 106 such as, for example, a crystalline silicon germanium layer (SiGe) disposed on the SOI layer 104; and a second silicon layer 108 disposed on the crystalline layer 106.

Figure 2A:
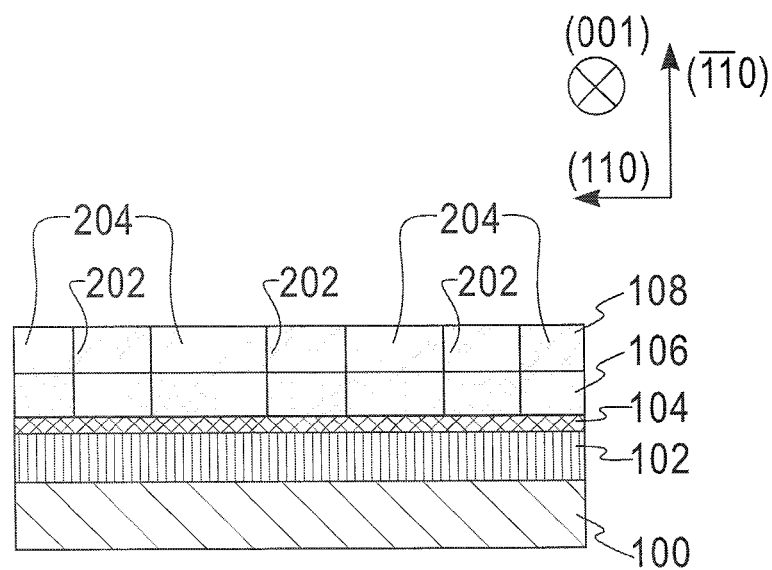
FIG. 2A illustrates a cross-sectional view of a resultant structure along the line 2A (of FIG. 2B)
Figure 2B:
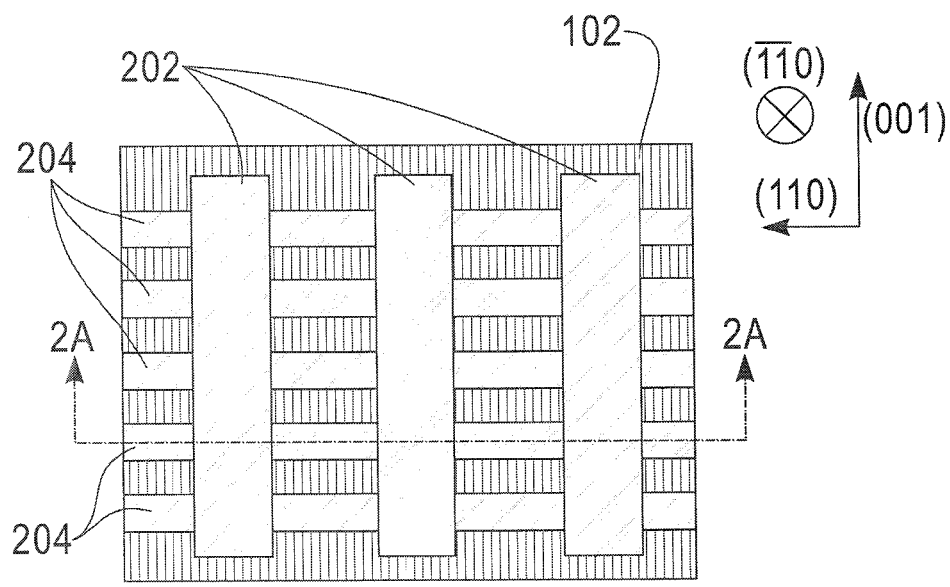
FIG. 2B illustrates a top down view and depicts the resultant structure including anchor portions and nanowire portions.

FIGS. 2A and 2B illustrate the resultant structure including anchor portions 202 and nanowire portions 204 that are patterned in the films stack formed by layers 104, 106, and 108. The anchor portions 202 and nanowire portions 204 may be patterned by the use of lithography followed by an etching process such as, for example, reactive ion etching (RIE). The etching process removes portions of the crystalline layer 108, 106, and the SOI layer 104 to expose portions of the BOX layer 102. The etched structure of FIG. 2B forms a ladder-like structure in which the rungs 204 have sidewalls parallel to the {100} crystal planes, and the anchors 202, which are connected by the rungs, have sidewalls parallel to the {110} crystal planes. In the example shown in FIG. 2B the rungs and the anchors forms a right angle (90°), the top surface of layer 108 is therefore parallel to the {110} crystal planes. The specification for crystal planes directions follows the Miller indices convention which is described in, e.g., Ashcroft and Mermin, Solid State Physics, chapter 5 (1976), the contents of which are incorporated herein by reference. Following this convention a family of crystal planes, i.e., planes that are equivalent by the virtue of the symmetry of the crystal is typically referenced by a pair of { } parentheses. For example, the planes (100), (010) and (001) are all equivalent in a cubic crystal. One refers to them collectively as {100} planes. In yet another example the {110} planes refer collectively to the (110), (101), (011), planes.

Figure 3A:
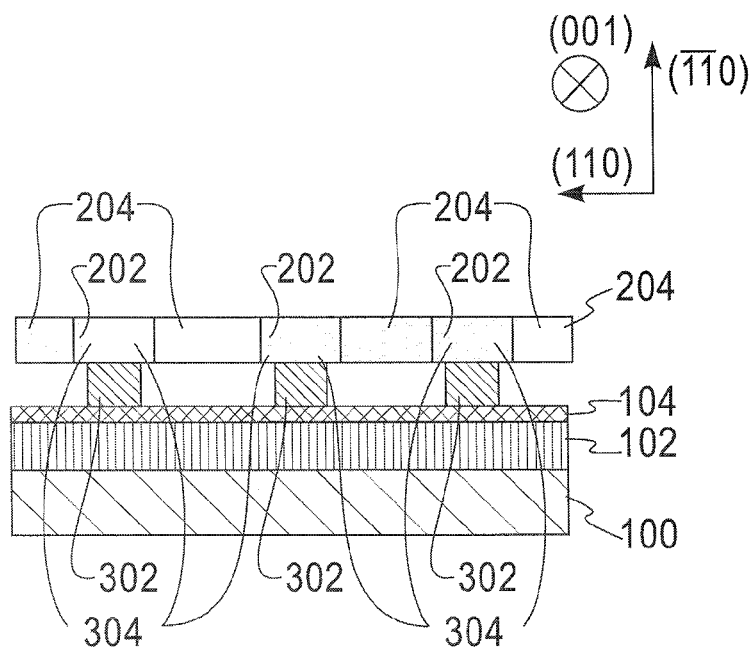
FIG. 3A illustrates a cross-sectional view of a resultant structure along the line 3A (of FIG. 3B)
Figure 3B:
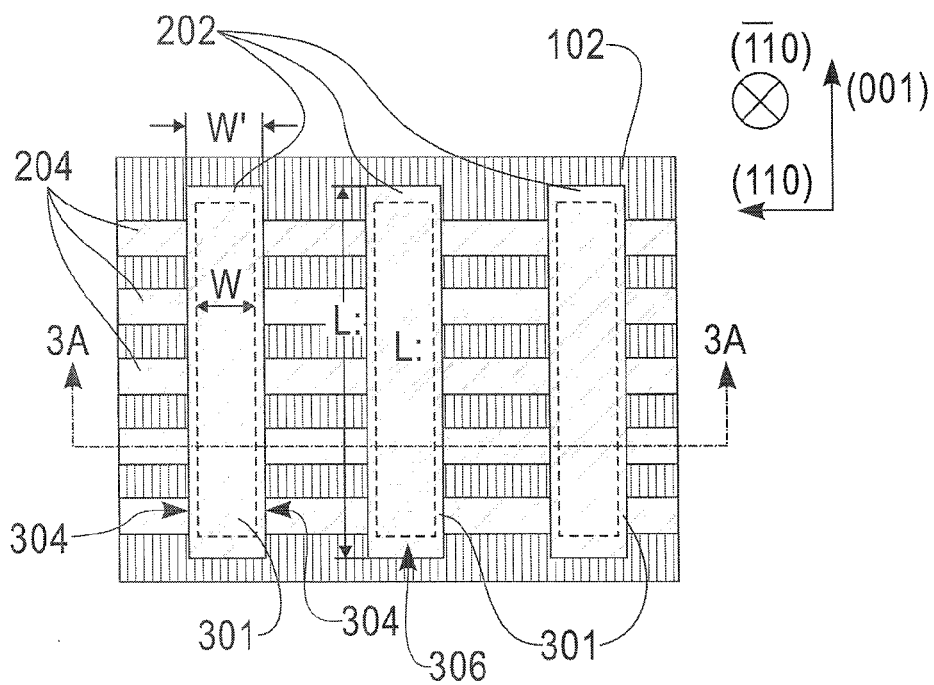
FIG. 3B illustrates a top down view and depicts the resultant structure following an anisotropic etching process.

FIGS. 3A and 3B illustrate the resultant structure following an anisotropic etching process that selectively removes portions of the crystalline layer 106 resulting in pedestal portions 302 that are defined in the crystalline layer 106 that support the anchor portions 202. The anisotropic etching process removes the portions of the crystalline layer 106 that are orientated along the lattice plane {100} at a faster rate than the portions of the crystalline layer 106 that are orientated along the lattice plane {110}, resulting in the removal of the crystalline layer 106 that is below the nanowire portions 204, and the suspension of the nanowire portions 204 by the anchor portions 202. FIG. 3B illustrates the top-down profile of the pedestal portions 302 (illustrated by the dotted lines 301) that support the anchor portions 202. The width (w) of the pedestal portions 302 is less than the width (w') of the anchor portions 202, resulting in longitudinal overhang regions 304. The length (L) of the pedestal portions 302 is less than the length (L') of the anchor portions 202 resulting in transverse overhang regions 306. The anisotropic etching process results in the longitudinal overhang regions 304 having a smaller overhang length (W'−W)/2 than the transverse overhang (L'−L)/2 regions 306 due to the {100} planes etching faster than {110} planes in crystalline layer 106. The anisotropic etch exhibits chemical selectivity. The etch chemistry mainly removes the crystalline material 106 but does not substantively etch the crystalline material 108. For example, when layer 108 is silicon and layer 106 is SiGe, hot (gaseous) HCL can be used to selectively etch SiGe with little removal of Si. Additionally, HCL provides an anisotropic etching process as it etches faster the SiGe in the (100) orientation than in the (110) orientation. The etching can be performed when the wafer is kept a temperature of about 800° C.

Figure 4A:
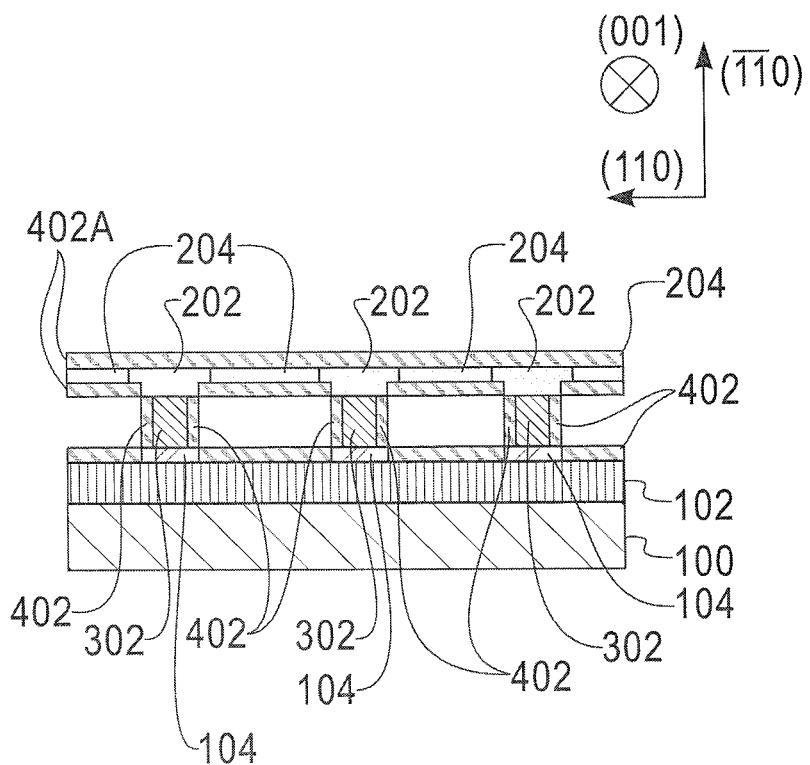
FIG. 4A illustrates a cross-sectional view of a resultant structure along the line 4A (of FIG. 4B)
Figure 4B:
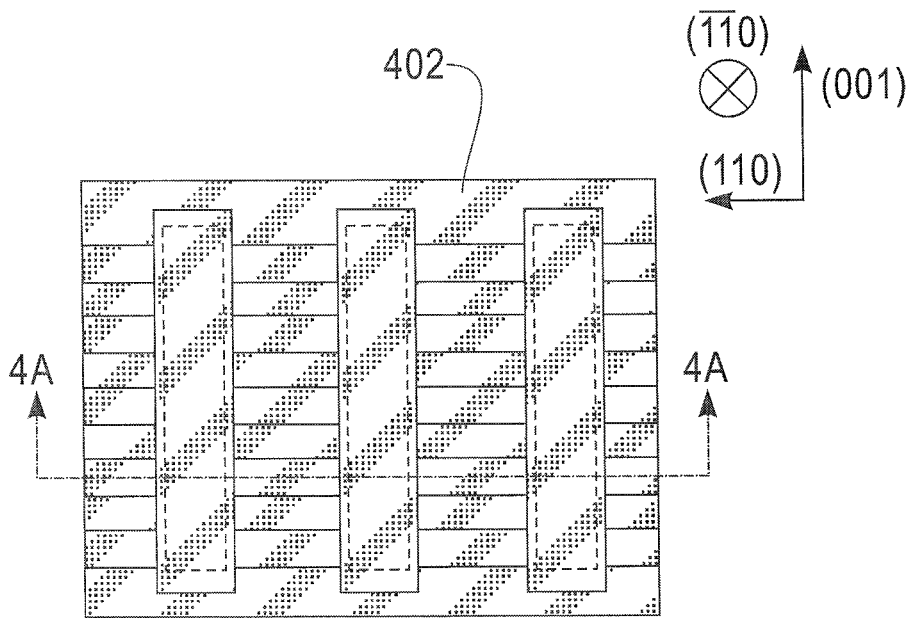
FIG. 4B illustrates a top down view and depicts the resultant structure following the formation of a thermal oxide layer.

FIGS. 4A and 4B illustrate the resultant structure following the formation of a thermal oxide layer 402 and 402A on the exposed anchor portions 202, nanowire portions 204, SOI layer 104, and pedestal portions 302. The oxidation process can be dry (with O2) or wet (with H2O vapor), with typical oxidation temperature from 750° C. to about 1000° C. The thermal oxidation process completely oxidizes the SOI layer 104 due to the thin thickness of the SOI layer 104 relative to the thicknesses of the anchor portions 202, nanowire portions 204, and pedestal portions 302.

Figure 5A:
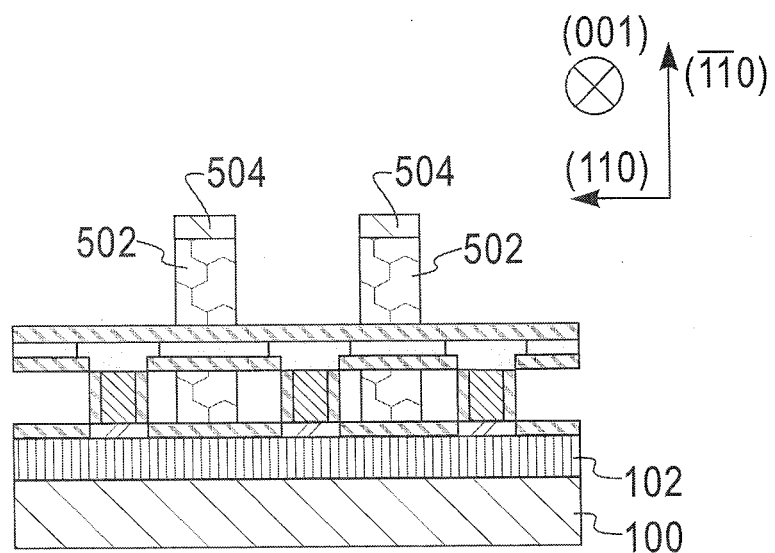
FIG. 5A illustrates a cross-sectional view of a resultant structure along the line 5A (of FIG. 5B)
Figure 5B:
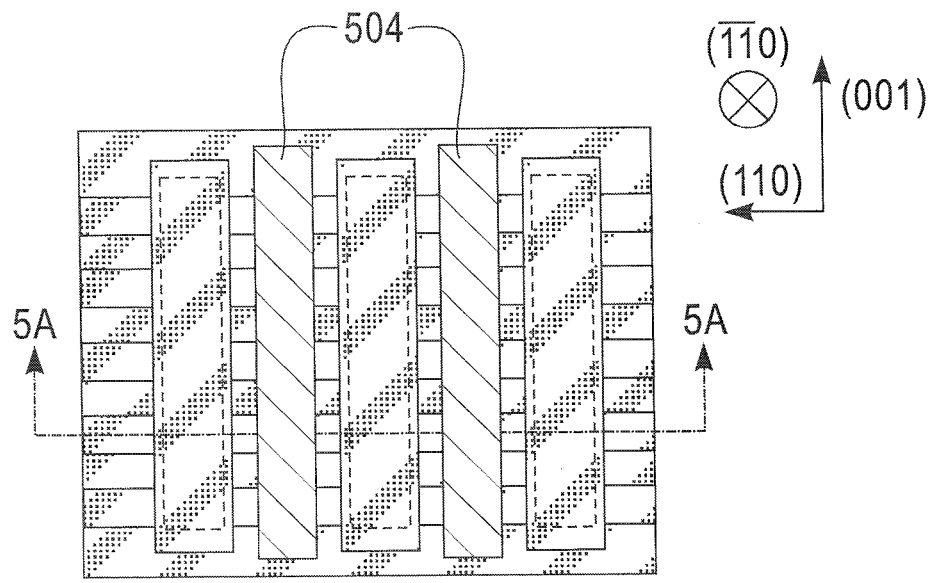
FIG. 5B illustrates a top down view and depicts the resultant structure following the formation of polysilicon gates and hardmask layers.

FIGS. 5A and 5B illustrate the resultant structure following the formation of polysilicon gates 502 and hardmask layers 504 such as, for example, silicon nitride (Si3N4) on the polysilicon gates 502. The polysilicon 502 and the hardmask layer 504 may be formed by depositing polysilicon material over channel regions of the nanowire portions 204, depositing the hardmask material over the polysilicon material, and etching by RIE to form the polysilicon gates 502 and the hardmask layers 504. The etching of the polysilicon gates 502 may be performed by directional etching that results in straight sidewalls of the gate 502. Following the directional etching, polysilicon 502 remains under the nanowire portions 204 and outside the region encapsulated by the gate 502. Isotropic etching may be performed to remove polysilicon 502 from under the nanowire portions 204.

Figure 6A:
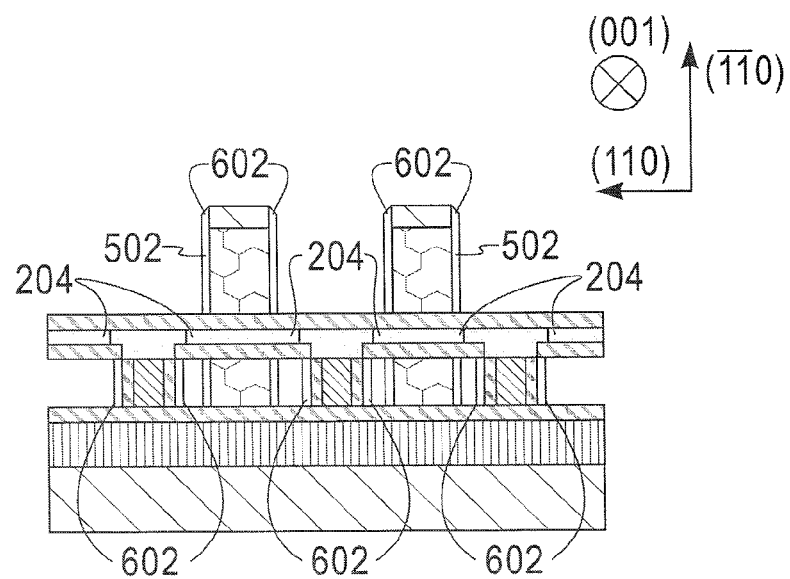
FIG. 6A illustrates a cross-sectional view of a resultant structure along the line 6A (of FIG. 6B)
Figure 6B:
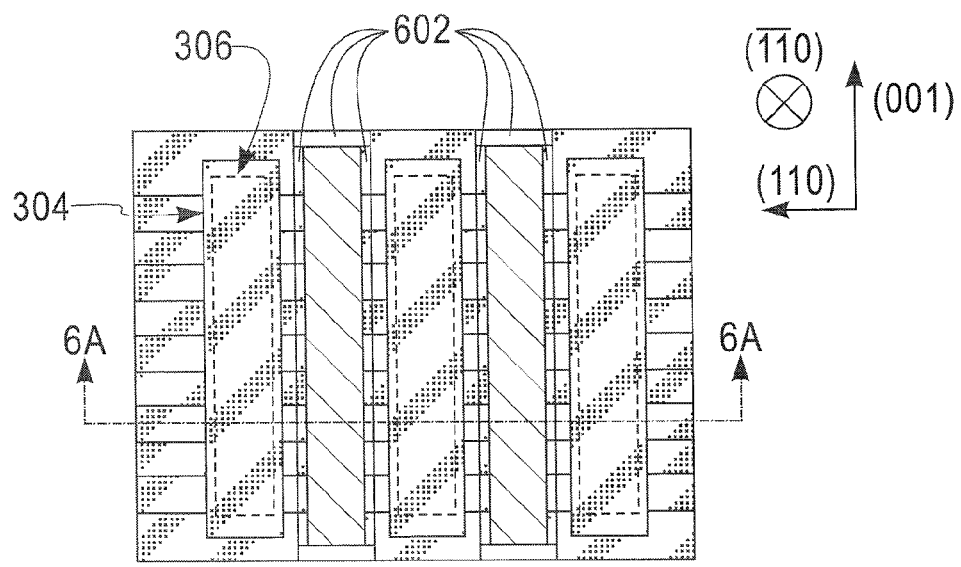
FIG. 6B illustrates a top down view and depicts the resultant structure following the formation of spacer portions along opposing sides of polysilicon gates.

FIGS. 6A and 6B illustrate spacer portions 602 formed along opposing sides of the polysilicon gates 502. The spacers 602 are formed by depositing a blanket dielectric film such as silicon nitride and etching the dielectric film from horizontal surfaces by RIE. FIGS. 6A and 6B include spacer portions 602 that are formed under the nanowire portions 204, and below the overhang regions 304 and 306.

Figure 7A:
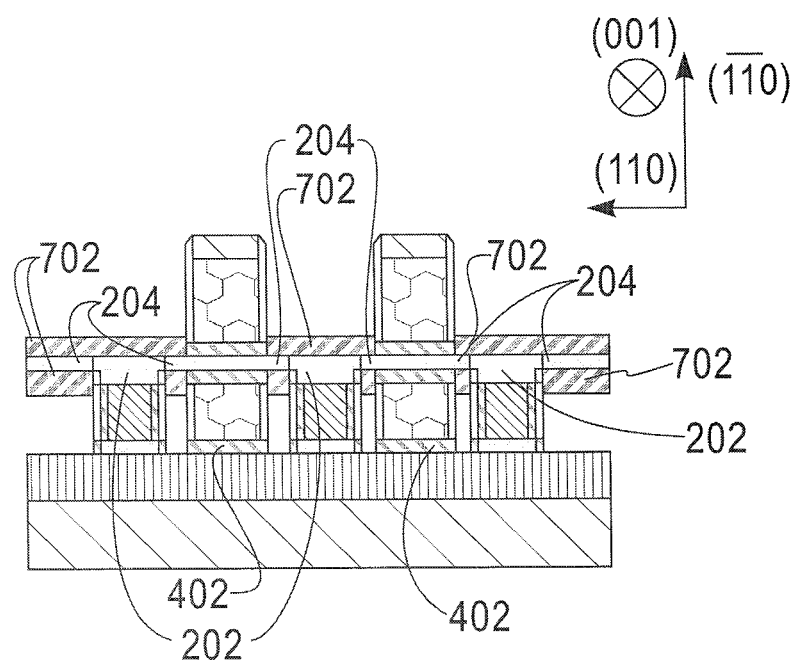
FIG. 7A illustrates a cross-sectional view of a resultant structure along the line 7A (of FIG. 7B)
Figure 7B:
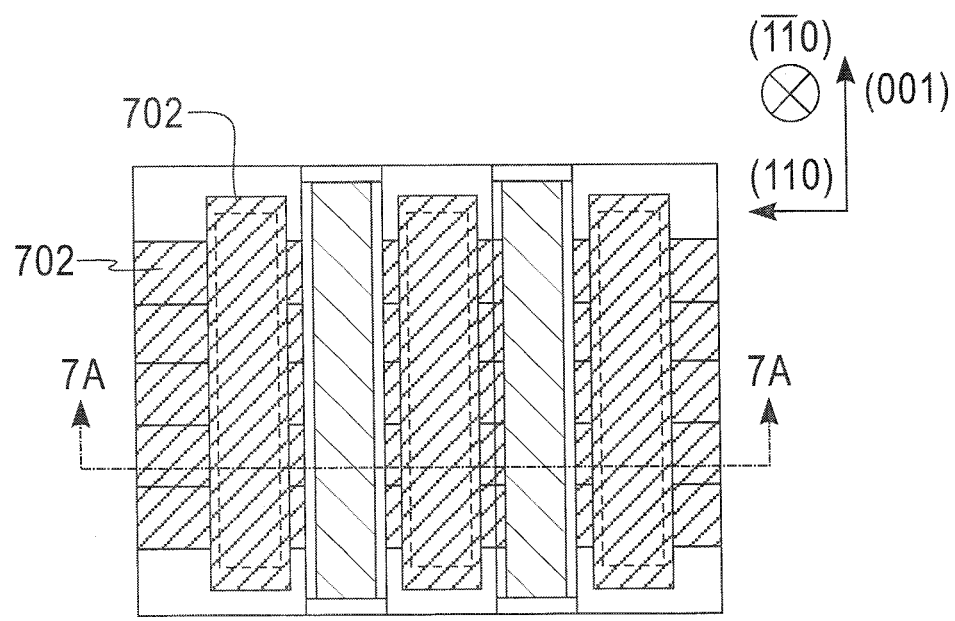
FIG. 7B illustrates a top down view and depicts the resultant structure following a chemical etching process and the selective epitaxial growth of silicon.

FIGS. 7A and 7B illustrate the resultant structures following a chemical etching process (such as etching with diluted HF) to remove the exposed portions of the thermal oxide layer 402 and a selective epitaxially grown silicon (epi-silicon) 702 that is grown on the exposed silicon of the anchor portions 202 and the nanowire portions 204. The epitaxy may include, for example, the deposition of in-situ doped silicon (Si) or silicon germanium (SiGe) that may be either n-type or p-type doped. The in-situ doped epitaxy process forms the source region and the drain region of the nanowire FET. As an example, a chemical vapor deposition (CVD) reactor may be used to perform the epitaxial growth. Precursors for silicon epitaxy include SiCl4, SiH4 combined with HCL. The use of chlorine allows selective deposition of silicon only on exposed silicon surfaces. A precursor for SiGe may include a mixture of SiCl4 and GeH4. For pure Ge epitaxy only GeH4 is used, and deposition selectivity is typically obtained without HCL. Precursors for dopants may include PH3 or AsH3 for n-type doping and B2H6 for p-type doping. Deposition temperatures may range from 550° C. to 1000° C. for pure silicon deposition, and as low as 300° C. for pure Ge deposition.

Figure 8A:
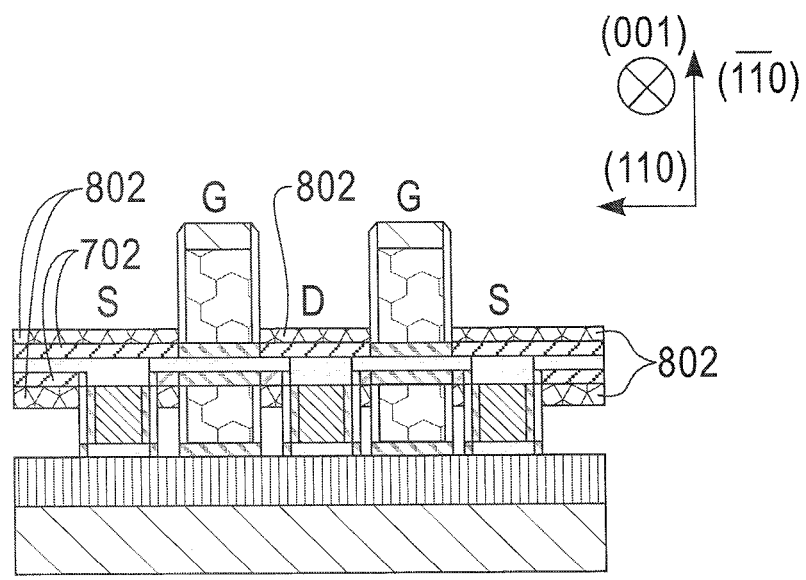
FIG. 8A illustrates a cross-sectional view of a resultant structure along the line 8A (of FIG. 8B)
Figure 8B:
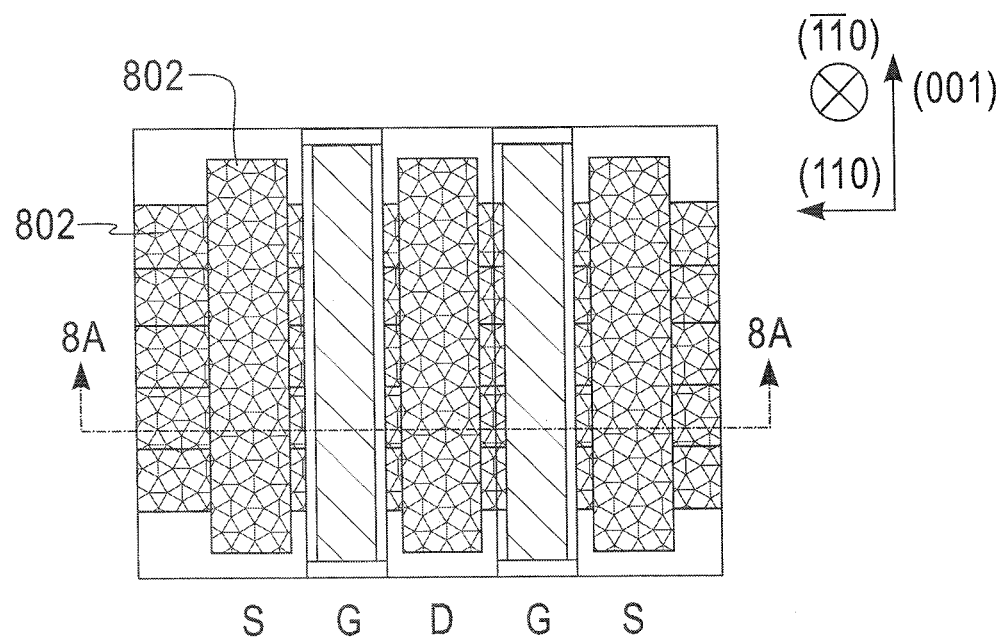

FIGS. 8A and 8B illustrate a resultant structure following silicidation where a silicide 802 is formed on the epi-silicon 702 of the anchor and the epi-thickened nanowire portions 202 and 204. Examples of silicide forming metals include Ni, Pt, Co, and alloys such as NiPt. When Ni is used the NiSi phase is typically formed due to its low resistivity. For example, formation temperatures include 400-600° C. Once the silicidation process is performed, capping layers and vias for connectivity (not shown) may be formed in the source (S), drain (D), and gate (G) regions of the device.

In an alternate exemplary method, high-K/metal gates may be formed on the nanowire portions 204. Referring to FIGS. 4A and 4B, the thermal oxide 402 around the nanowire portions 204 and along the sides of the pedestal portions 302 may be removed by an etching process. A chemical oxide material may be grown on the exposed silicon material, and high-K and gate metal layers are deposited conformally prior to the deposition and etching to form the polysilicon portions 502 and hardmask layers 504 (of FIGS. 5A and 5B). Once the polysilicon 502 and hardmask layers 504 are formed, etching may be performed to remove exposed metal gate material that is not covered by the polysilicon 502. Once the exposed metal gate material is removed, the method may continue as described in FIGS. 6A-8B above.

Figure 9:
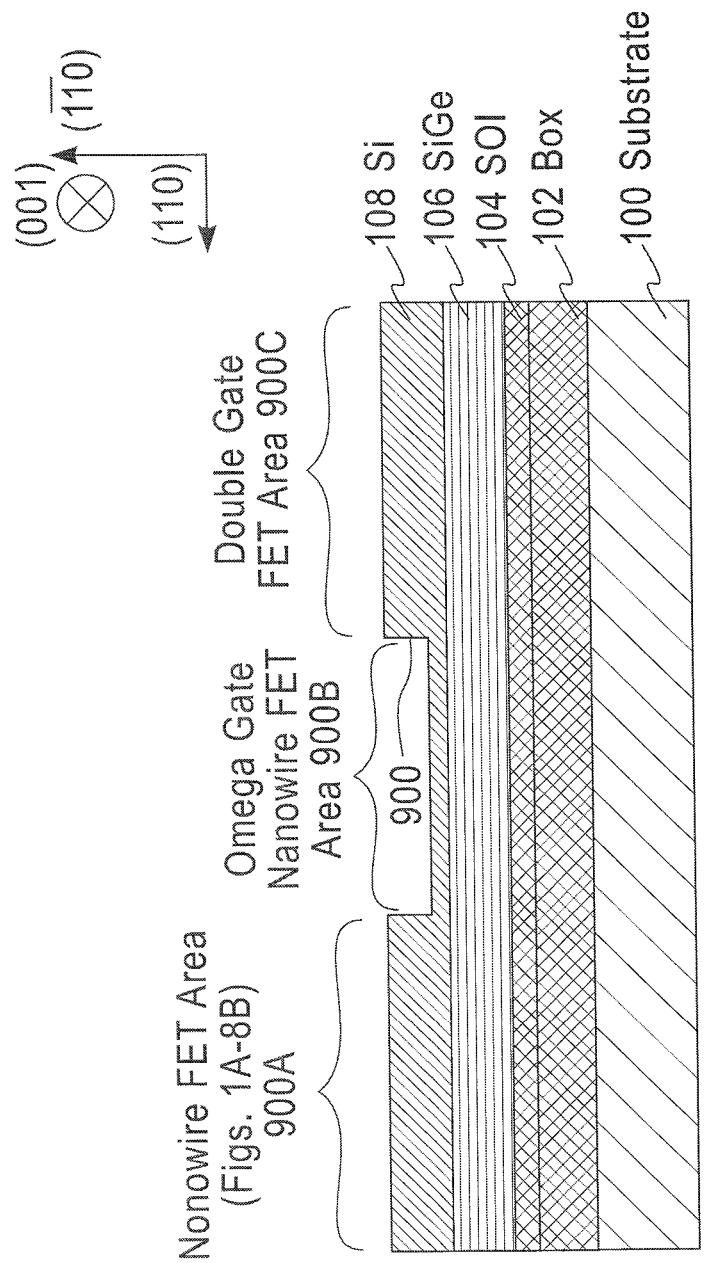
FIG. 9 shows a portion of the substrate of FIG. 1A having regions for forming a nanowire FET area, an omega-gate nanowire FET area, and a double gate FET area.

The foregoing process as described in copending U.S. patent application Ser. No. 12/776,485, filed 10 May 2010 is modified and enhanced to form a plurality of FET types over the same substrate 100. In this embodiment, and referring to FIG. 9, a first FET type can be the suspended nanowire FET structure as shown in FIGS. 1A-8B that is formed in an area designated 900A. A second FET type is an omega gate (non-suspended) nanowire FET structure that is formed in an area 900B. A third FET type is a double (suspended) gate FET structure that is formed in an area 900C. FIG. 9 shows that an (optional) etch can be performed to form a step or recess 900 into the Si layer 108, thereby enabling the FET structure to have a greater height (increased FIN height) than the FET structures disposed on either side. Note that the omega gate (non-suspended) nanowire FET structure is fabricated on the Si layer 108 and is not undercut as are the suspended nanowire FET structure and the double gate FET structure.

Figure 10:
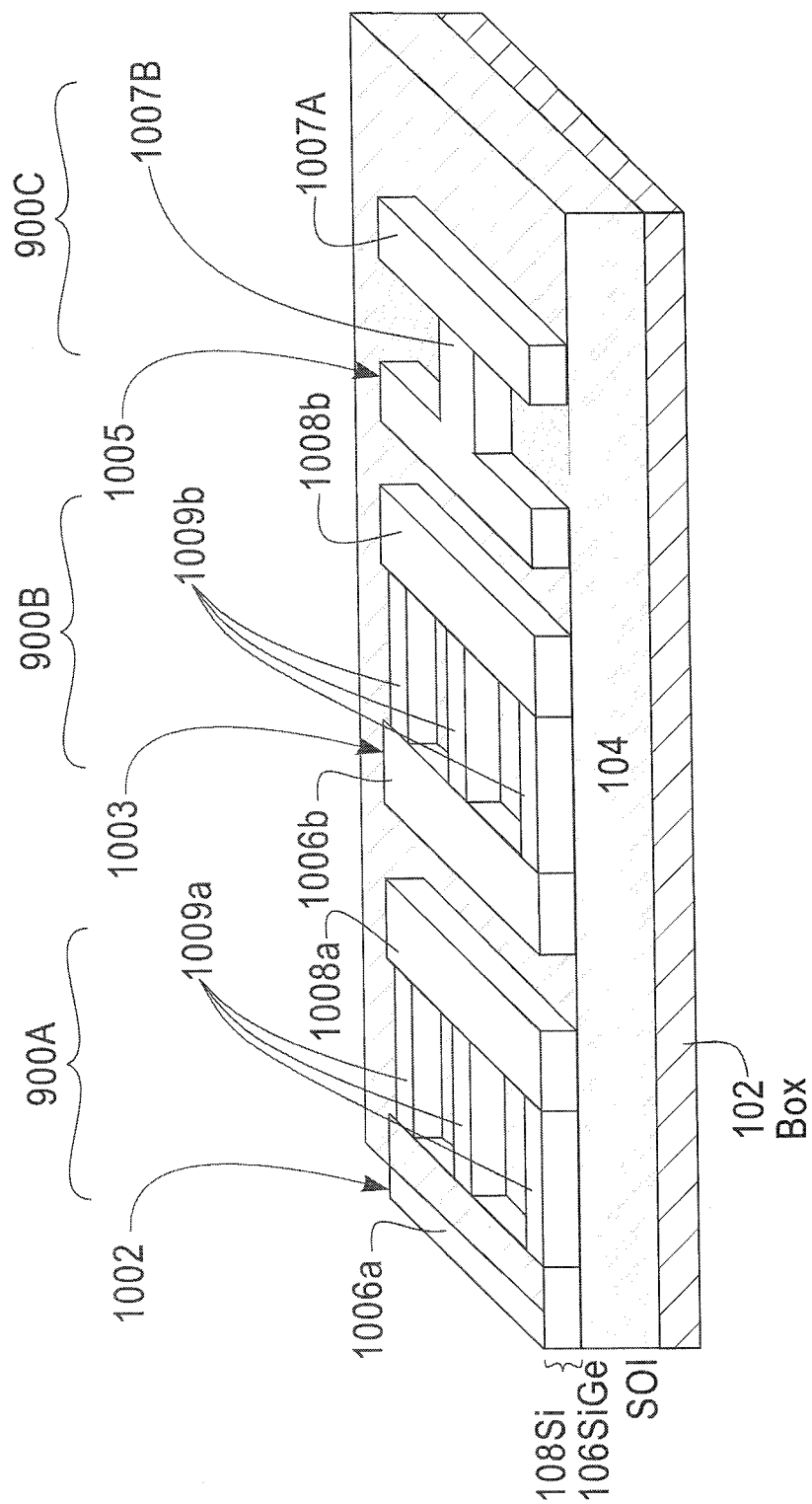
FIG. 10 shows precursor structures for forming the nanowire FET, omega-gate nanowire FET and the double gate FET.

FIG. 10 shows the BOX 102, the silicon on insulator (SOI) 104 and the overlying SiGe 106 and Si 108 layers. The SiGe 106 and Si 108 layers are used to form the gate all-around nanowire FET device in a portion 1002, as shown in FIGS. 1A-8B, as well as a double (suspended) gate FET device that is fabricated in a portion 1005. The double (suspended) gate FET device is formed using the directional etch process described above that undercuts and releases the nanowires of the suspended nanowire FET device and the doubled gated FET device, but not the middle omega gate FET device. All depositions, spacers and the like are applied to the double gate FET device in region 1005 in the same manner and at the same time as in the processing of the suspended nanowire FET device in the region 1002, as described in FIGS. 1A-8B. In practice the double gate FET device resembles a wide, single nanowire FET device where the cross-bar of the 'H' shaped structure is the suspended gate and the orthogonally disposed ends of the 'H' shaped structure are the pads. As in the nanowire FET device formed in the region 1002, the single, wide channel portion of the double gated FET device has sidewalls that are parallel to {100} crystalline planes, and the source region pad and the drain region pad having sidewalls that are parallel to {110} crystalline planes and are formed by using the same anisotropic etch that removes primarily material from {100} crystalline planes of the first semiconductor layer such that the channel portion (cross-bar of the 'H' shaped structure) is suspended by the source region pad and the drain region pad.

Figure 11A:
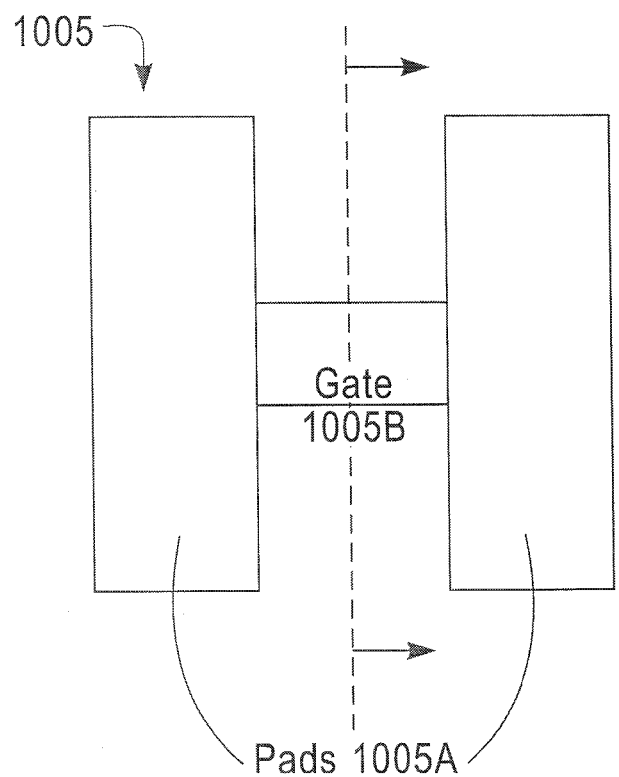
FIG. 11A is a top view and FIG. 11B is a cross-sectional view of the double gate FET.
Figure 11B:
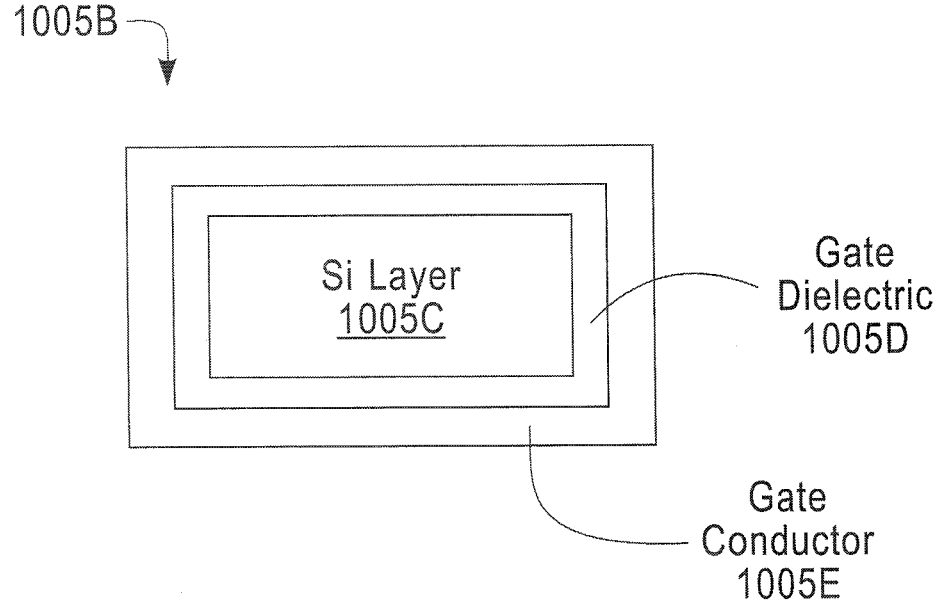

FIG. 11 is a top view (11A) and a cross-sectional view (11B) of the double gated FET device formed in the region 1005. The gate 1005 is suspended between pads 1005A and includes a Si core 1005C from layer 108, a surrounding gate dielectric 1005D and a surrounding gate conductor 1005E (metal and/or polysilicon). In a non-limiting example the Si layer 1005C on the order of 5 nm-40 nm in thickness with a width on the order of 100 nm to several microns, where the width dimension is limited only by the undercut of the etch. Spacers on the gate edge (not shown) and metal contacts and metal (not shown) are the same as in the suspended nanowire FET device described above in reference to FIGS. 1A-8B.

Figure 12A:
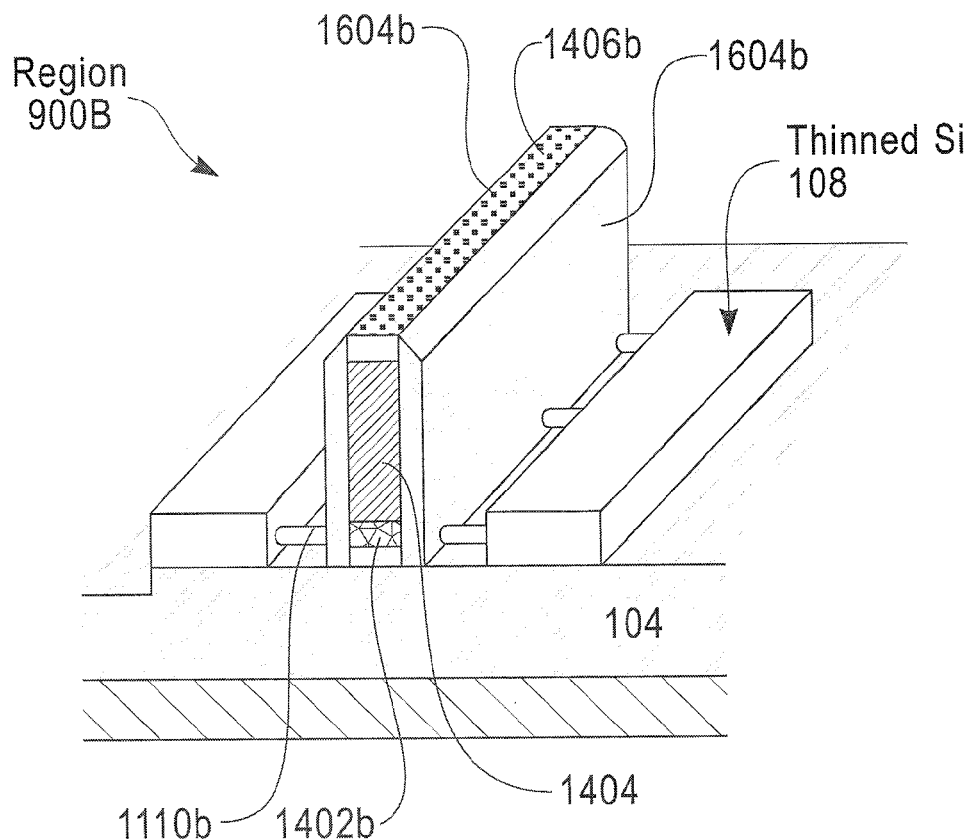
FIGS. 12A and 12B depict aspects of the omega-gate FET device.
Figure 12B:
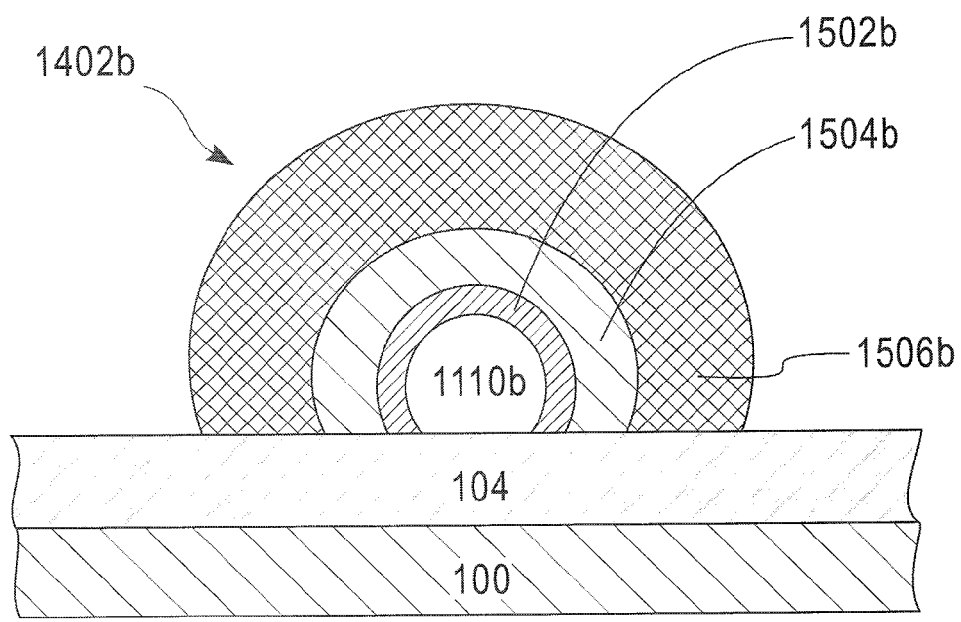

In the thinned Si region 900B of FIG. 9 the omega gate (non-suspended) nanowire FET device 1003 can be formed. Reference in this regard can be made to copending U.S. patent application Ser. No. 12/631,342, filed 4 Dec. 2009. Referring to FIGS. 12A and 12B, briefly an oxidation process is used to reduce the dimensions of the nanowire regions 1009b shown in FIG. 10 forming nanowires 1110b. Gates 1402b are formed around the thinned nanowires 1110b and capped with a polysilicon layer 1404. A hardmask line 1406b is defined by patterning, for example a silicon nitride ($Si_3N_4$) layer that is deposited over the polysilicon layer 1404. The polysilicon layer 1404 and the hardmask line 406b may be formed by depositing polysilicon material over the BOX layer 104 and the thinned Si layer 108, depositing the hardmask material over the polysilicon material, and etching by RIE to form the polysilicon line 1404b. The etching of the gates 1402b may be performed by directional etching that results in straight sidewalls of the gates. The gate stack 1402b is formed by depositing a conformal gate dielectric film such as $SiO_2$, SiON, or $HfO_2$ (or other hi-K material) around the nanowires. A second conformal gate dielectric film may also be applied. A metal gate film such as, for example, TaN or TiN is deposited over the gate dielectric. The polysilicon 1404 is deposited over the metal gate film of the gates.

FIG. 12B shows a cross sectional view of the gate 1402b. The gate 1402b is formed by depositing a first gate dielectric layer 1502b, such as silicon dioxide ($SiO_2$) around the nanowire 1110b. A second gate dielectric layer 1504b such as, for example, hafnium oxide ($HfO_2$) is formed around the silicon oxide layer 1502b. A metal layer 1506b such as, for example, tantalum nitride (TaN) is formed around the dielectric layer 1504b. The metal layer 1506b is surrounded by the polysilicon layer 1404. Doping the polysilicon layer 1404 with impurities such as boron (p-type), or phosphorus (n-type) makes the polysilicon layer 1404 conductive. The channel of this device is planar as it forms in the thinned Si slab, and the films comprising gate stack also have a planar geometry.

Also shown in FIG. 12A are spacer portions 1604b formed along opposing sides of the polysilicon line 1404b. The spacers 1604b are formed by depositing a blanket dielectric film such as silicon nitride and etching the dielectric film from all horizontal surfaces by RIE. The spacers 1604b are formed around portions of the nanowires 1110b that extend from the polysilicon layer 1104b and surround portions of the nanowires 1110b.

Subsequent processing can include a selective epi-silicon growth that thickens the exposed nanowire portions not covered by the gate 1404b and spacers 1604b, as well as a silicidation process where a silicide is formed on the exposed epitaxy. Examples of silicide forming metals include Ni, Pt, Co, and alloys such as NiPt. When Ni is used the NiSi phase is formed due to its low resistivity. For example, formation temperatures include 400-600° C. Once the silicidation process is performed, capping layers and vias for connectivity (not shown) may be formed In general the nanowire dimensions (width×height) can be in an exemplary range of about 3×3 nm to about 20×20 nm. The nanowire cross-section shape can be, for example, rounded, rectangular, elliptical or circular.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a Acircuit,@ Amodule @ or Asystem.@ Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent mathematical expressions may be used by those skilled in the art. However, all such and similar modifications of the teachings of this invention will still fall within the scope of this invention.

What is claimed is:

1. A substrate, comprising:
   a first source region comprising a first semiconductor layer disposed on a second semiconductor layer, the first source region having a surface parallel to $\{110\}$ crystalline planes and opposing sidewall surfaces parallel to the $\{110\}$ crystalline planes;
   a first drain region comprising the first semiconductor layer disposed on the second semiconductor layer, the first drain region having a face parallel to the {110} crystalline planes and opposing sidewall surfaces parallel to the {110} crystalline planes;
a plurality of nanowire channel members suspended by the first source region and the first drain region, where the nanowire channel members are formed from the first semiconductor layer, and have opposing sidewall surfaces parallel to {100} crystalline planes and opposing faces parallel to the {110} crystalline planes;
a second source region comprising the first semiconductor layer disposed on the second semiconductor layer, the second source region having a surface parallel to {110} crystalline planes and opposing sidewall surfaces parallel to the {110} crystalline planes;
a second drain region comprising the first semiconductor layer disposed on the second semiconductor layer, the second drain region having a face parallel to the {110} crystalline planes and opposing sidewall surfaces parallel to the {110} crystalline planes; and
a single channel member suspended by the second source region and the second drain region, where the single channel member is formed from the first semiconductor layer, and has opposing sidewall surfaces parallel to {100} crystalline planes and opposing faces parallel to the {110} crystalline planes, where a width of the single channel member is at least several times a width of a single nanowire member.

2. The substrate of claim 1, further comprising a first gate formed around a portion of the nanowire channel members and a second gate formed around a portion of the single channel member.

3. The substrate of claim 1, further comprising an omega-gate nanowire FET.

4. The substrate of claim 3, where the omega-gate nanowire FET is formed on a thinned portion of the first semiconductor layer.

5. The substrate of claim 1, where the first semiconductor layer includes silicon and where the second semiconductor material includes SiGe.

6. An integrated circuit comprising a plurality of field effect transistor (FET) devices disposed over a common substrate, said plurality of FET devices comprising:
a first source region comprising a first semiconductor layer disposed on a second semiconductor layer, the first source region having a surface parallel to {110} crystalline planes and opposing sidewall surfaces parallel to the {110} crystalline planes;
a first drain region comprising the first semiconductor layer disposed on the second semiconductor layer, the first drain region having a face parallel to the {110} crystalline planes and opposing sidewall surfaces parallel to the {110} crystalline planes;
a plurality of nanowire channel members suspended by the first source region and the first drain region, where the nanowire channel members are formed from the first semiconductor layer, and have opposing sidewall surfaces parallel to {100} crystalline planes and opposing faces parallel to the {110} crystalline planes;
a second source region comprising the first semiconductor layer disposed on the second semiconductor layer, the second source region having a surface parallel to {110} crystalline planes and opposing sidewall surfaces parallel to the {110} crystalline planes;
a second drain region comprising the first semiconductor layer disposed on the second semiconductor layer, the second drain region having a face parallel to the {110} crystalline planes and opposing sidewall surfaces parallel to the {110} crystalline planes;
a single channel member suspended by the second source region and the second drain region, where the single channel member is formed from the first semiconductor layer, and has opposing sidewall surfaces parallel to {100} crystalline planes and opposing faces parallel to the {110} crystalline planes; and
a first gate formed around at least a portion of the nanowire channel members and a second gate formed around at least a portion of the single channel member.

7. The integrated circuit of claim 6, further comprising an omega-gate nanowire FET device.

8. The integrated circuit of claim 7, where the omega-gate nanowire FET device is formed on a thinned portion of the first semiconductor layer.

9. The integrated circuit of claim 6, where the first semiconductor layer includes silicon and where the second semiconductor material includes SiGe.

10. The integrated circuit of claim 6, where a width of the single channel member is at least several times a width of a single nanowire member.

11. An integrated circuit comprising:
a plurality of field effect transistor (FET) devices disposed over a common silicon on insulator (SOI) substrate comprising a layer of buried oxide (BOX) having an overlying layer of silicon, said plurality of FET devices comprising:
a first source region comprising a first semiconductor layer disposed on top of a second semiconductor layer that is disposed on top of the layer of silicon, the first source region having a surface parallel to {110} crystalline planes and opposing sidewall surfaces parallel to the {110} crystalline planes;
a first drain region comprising the first semiconductor layer disposed on top of the second semiconductor layer that is disposed on top of the layer of silicon, the first drain region having a face parallel to the {110} crystalline planes and opposing sidewall surfaces parallel to the {110} crystalline planes;
a plurality of nanowire channel members suspended by the first source region and the first drain region, where the nanowire channel members are formed from the first semiconductor layer and have opposing sidewall surfaces parallel to {100} crystalline planes and opposing faces parallel to the {110} crystalline planes;
a second source region comprising the first semiconductor layer disposed on top of the second semiconductor layer that is disposed on top of the layer of silicon, the second source region having a surface parallel to {110} crystalline planes and opposing sidewall surfaces parallel to the {110} crystalline planes;
a second drain region comprising the first semiconductor layer disposed on top of the second semiconductor layer that is disposed on top of the layer of silicon, the second drain region having a face parallel to the {110} crystalline planes and opposing sidewall surfaces parallel to the {110} crystalline planes;
a single channel member suspended by the second source region and the second drain region, where the single channel member is formed from the first semiconductor layer and has opposing sidewall surfaces parallel to {100} crystalline planes and opposing faces parallel to the {110} crystalline planes, where a width of the single channel member is at least several times a width of a single nanowire member; and a first gate formed around at least a portion of the nanowire channel members and a second gate formed around at least a portion of the single channel member.

12. The integrated circuit of claim 11, where the first semiconductor layer includes silicon and where the second semiconductor material includes SiGe.

* * * * *